US012574053B2

(12) United States Patent
Bioglio et al.

(10) Patent No.: US 12,574,053 B2
(45) Date of Patent: Mar. 10, 2026

(54) APPARATUS AND METHOD FOR GENERATING A FROZEN SET ASSOCIATED WITH A POLAR CODE

(71) Applicant: HUAWEI TECHNOLOGIES CO., LTD., Shenzhen (CN)

(72) Inventors: Valerio Bioglio, Munich (DE); Charles Pillet, Munich (DE); Ingmar Land, Munich (DE)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/613,097

(22) Filed: Mar. 21, 2024

(65) Prior Publication Data

US 2024/0243759 A1 Jul. 18, 2024

Related U.S. Application Data

(63) Continuation of application No. PCT/EP2021/076444, filed on Sep. 27, 2021.

(51) Int. Cl.
H03M 13/00 (2006.01)

(52) U.S. Cl.
CPC ....... H03M 13/616 (2013.01); H03M 13/611 (2013.01); H03M 13/612 (2013.01)

(58) Field of Classification Search
CPC ............. H03M 13/616; H03M 13/611; H03M 13/612; H03M 13/033; H03M 13/13
See application file for complete search history.

(56) References Cited

U.S. PATENT DOCUMENTS

2020/0412385 A1* 12/2020 Arikan ................ H03M 13/616

OTHER PUBLICATIONS

Erdal Arkan:"Channel polarization: A method for constructing capacity achieving codes for symmetric binary-input memoryless channels", IEEE Transactions on Information Theory, vol. 55, No. 7, Jul. 2009, total 23 pages.
Ido Tal et al., "List decoding of polar codes", IEEE Transactions on Information Theory, vol. 61,No. 5, arxiv:1206.0050v1,May 31, 2012, total 11 pages.
Orion Afisiadis et al., "A low-complexity improved successive cancellation decoder for polar codes",in Asilomar Conf.on Signals, Syst and Comput, Nov. 2014, total 5 pages.

(Continued)

*Primary Examiner* — Thien Nguyen

(57) ABSTRACT

An apparatus for generating a frozen set associated with a polar code of length 'N' and dimension 'K' comprises a processing unit configured to take in input the polar code length 'N', the dimension 'K', and a profile of a structure of a block lower triangular affine (BLTA) group. The BLTA group structure is associated with an affine transformation matrix of size 'n×n' and the profile is an ordered set of a plurality of values corresponding to block sizes of blocks. The blocks are sub-matrices of the affine transformation matrix with all the diagonals of blocks in the same order as the ordered block sizes, forming the diagonal of the affine transformation matrix, each of the block sizes is such that 'n' is equal to the sum of block sizes and 'n' is equal to $\log_2(N)$. The processing unit generates the frozen set.

15 Claims, 6 Drawing Sheets

(56) References Cited

OTHER PUBLICATIONS

Marvin Geiselhart et al., "Automorphism Ensemble Decoding of Reed-Muller Codes", arxiv:2012.07635v1, Dec. 14, 2020, total 14 pages.

Magali Bardet et al., "Algebraic properties of polar codes from a new polynomial formalism", in 2016 IEEE International Symposium on Information Theory (ISIT), 2016, total 5 pages.

Harish Vangala et al., "A comparative study of polar code constructions for the AWGN channel", arXiv:1501.02473v1,Jan. 11, 2015, total 9 pages.

Marvin Geiselhart et al., "On the automorphism group of polar codes", arXiv:2101.09679v3, May 11, 2021, total 7 pages.

Charles Pillet et al., "Polar Codes for Automorphism Ensemble Decoding", arXiv:2102.08250v1, Feb. 16, 2021, total 6 pages.

Yuan Li et al., "The Complete Affine Automorphism Group of Polar Codes", arXiv:2103.14215v1,Mar. 26, 2021, total 6 pages.

Valerio Bioglio et al., "Design of Polar Codes in 5G New Radio", in IEEE Communications Surveys and Tutorials, vol. 23, No. 1,2021, total 12 pages.

* cited by examiner

200

OBTAINING AS INPUT POLAR CODE LENGTH N,
INFORMATION LENGTH K, AND PROFILE OF STRUCTURE OF
BLOCK LOWER TRIANGULAR AFFINE, BLTA, GROUP, SAID
BLTA GROUP STRUCTURE BEING ASSOCIATED WITH
TRANSFORMATION MATRIX OF SIZE N X N, SAID PROFILE
BEING DEFINED BY ORDERED SET OF PLURALITY OF VALUES
CORRESPONDING TO BLOCK SIZES OF A PLURALITY OF
BLOCKS, SAID BLOCKS BEING SUB-MATRICES OF SAID
TRANSFORMATION MATRIX, WITH ALL DIAGONALS OF SAID
BLOCKS, IN SAME ORDER AS ORDERED PLURALITY OF
BLOCK SIZES, FORMING DIAGONAL OF SAID
TRANSFORMATION MATRIX, EACH OF BLOCK SIZES BEING
SUCH THAT N IS POWER OF TWO OF SUM OF SAID BLOCK
SIZES
202

GENERATING FROZEN SET SO THAT ASSOCIATED POLAR
CODE ADMITS ALL AFFINE AUTOMORPHISMS BELONGING TO
SAID BLTA GROUP
204

FIG. 2

FIG. 5

APPARATUS AND METHOD FOR GENERATING A FROZEN SET ASSOCIATED WITH A POLAR CODE

CROSS-REFERENCE TO RELATED APPLICATIONS

This application is a continuation of International Application No. PCT/EP2021/076444, filed on Sep. 27, 2021, the disclosure of which is hereby incorporated by reference in its entirety.

TECHNICAL FIELD

The present disclosure relates generally to the field of digital communication, and more specifically, to an apparatus for generating a frozen set associated with a polar code, a communication device comprising the apparatus, and a method for generating the frozen set associated with the polar code.

BACKGROUND

Generally, a channel coding scheme is used in all digital communications systems to detect and correct bit errors. Typically, the channel coding scheme refers to a system for forward error correction (FEC) coding, which consists of an encoder at the transmitter side and a decoder at the receiver side. The encoder adds redundancy to the data to be transmitted, i.e., additional redundant data, and the decoder exploits this redundancy to correct transmission errors such that the receiver obtains the transmitted data free of errors despite the noisy communication channel. Generally, polar codes are used in the channel coding scheme to sort the bit positions of data or bit-channels in order of reliability. As the code length increases towards infinity, the polarization phenomenon of the polar codes influences the reliability of bit-channels, which are either completely noisy or completely noiseless. However, for finite practical code lengths, the polarization of bit-channels is incomplete, therefore, there are bit-channels that are partially noisy.

Conventionally, the polar code decoding is based on conventional successive cancellation (SC) decoding algorithm, which is inherently sequential. The conventional successive cancellation decoding algorithm can be viewed as a binary tree search, where bits are estimated at leaf nodes, and the tree is traversed depth-first, with priority given to one branch (e.g., the left branch). In the conventional successive cancellation decoding, the decoder starts with a decision for first bit and feeds this decision back into the decoding process; then it makes a decision of second bit and feeds this decision back into the decoding process; it proceeds in this fashion until it obtains the design for the last bit. Further, in the conventional successive cancellation list (SCL) decoding, which is an enhanced version of the conventional successive cancellation decoding, multiple bits are followed during the decoding and the decision is postponed to the end of the decoding process, which is usually performed with the help of a cyclic redundancy check (CRC).

In certain scenarios, a conventional automorphism ensemble decoder is used, which runs multiple SC-based decoders in parallel, each one having as input a permuted version of the received code word, usually represented by soft values from the channel. These permutations are taken from the automorphism group of the code, and they always map code words into code words; as a result, a permuted code word remains in the original codebook. However, if the permutations are not chosen with great care, the result of permutations commuted with SC-based decoders is identical to the decoding of the un-permuted code word. Thus, there exists a technical problem of inefficiency and unreliability associated with conventional methods for generating polar codes.

Therefore, in light of the foregoing discussion, there exists a need to overcome the aforementioned drawbacks associated with conventional methods for generating polar codes.

SUMMARY

The present disclosure provides an apparatus for generating a frozen set associated with a polar code, a communication device, and a method for generating the frozen set associated with the polar code. The present disclosure provides a solution to the existing problem of inefficiency and unreliability associated with conventional methods for generating polar codes. An aim of the present disclosure is to provide a solution that overcomes at least partially the problems encountered in prior art, and provide an improved apparatus and method for generating a frozen set associated with a polar code such that they efficiently and reliably admit automorphisms belonging to a given block lower triangular affine (BLTA) group. Moreover, the polar codes are generated such that their automorphism group includes some elements of the upper triangular linear (UTL) group. Additionally, the polar codes are generated in such a way that they can be decoded under automorphism ensemble decoding using the desired permutations and exhibit lower latency and good block error rate (BLER) performance improvement compared to the conventional SC and SCL decoding.

It is reminded that a polar code is a set of codewords, and a polar code is said to admit a specific automorphism when any codeword belonging to this polar code can be transformed by this particular specific automorphism into a codeword belonging also to said polar code.

One or more objectives of the present disclosure is achieved by the solutions provided in the enclosed independent claims. Advantageous implementations of the present disclosure are further defined in the dependent claims.

In one aspect, the present disclosure provides an apparatus for generating a frozen set associated with a polar code of length 'N' and dimension 'K'. The frozen set is of size 'N–K' and comprises bit indices. The apparatus comprises a processing unit configured to obtain as an input the polar code length 'N', the dimension 'K', and a profile of a structure of a block lower triangular affine (BLTA) group. The said BLTA group structure is associated with an affine transformation matrix of size 'n×n'. The said profile is defined by an ordered set of a plurality of values corresponding to block sizes of a plurality of blocks. The said blocks are sub-matrices of said affine transformation matrix, all the diagonals of said blocks in the same order as the ordered plurality of block sizes, forming the diagonal of said affine transformation matrix, and each of the block sizes is such that 'n' is equal to the sum of said block sizes and 'n' is equal to $\log_2(N)$. The processing unit is further configured to generate the frozen set so that the associated polar code admits all affine automorphisms belonging to said BLTA group.

The apparatus of the present disclosure provides an improved solution for generating a frozen set associated with a polar code such that it efficiently and reliably admits automorphisms belonging to a given block lower triangular affine (BLTA) group. Moreover, the polar codes are generated such that their automorphism group includes some elements of the upper triangular linear (UTL) group. Additionally, the polar codes are generated in such a way that they can be decoded under automorphism ensemble decoding using the desired permutations and exhibit lower latency and good block error rate (BLER) performance improvement compared to the conventional successive cancellation (SC) and successive cancellation list (SCL) decoding.

In an implementation form, the blocks are upper diagonal sub-matrices. Alternatively, the blocks can be permutation sub-matrices.

Beneficially, polar codes are generated such that their automorphism group includes some elements of the upper triangular linear (UTL) group.

In a further implementation form, the polar code is associated with a generating monomials set corresponding to an information set of size 'K', and the processing unit is further configured to generate said generating monomials set so that the associated polar code admits all affine automorphisms belonging to the BLTA group, and generate the frozen set from said generating monomials set.

By virtue of the generating monomials set, the polar code admits all the affine automorphisms belonging to the BLTA group.

In a further implementation form, the processing unit is further configured to determine an initial generating monomials set, define a current generating monomial set as being the initial generating monomials set, and perform a loop, this loop comprising repeating, for each given block of the ordered blocks corresponding to the ordered block sizes in the profile: a determination of a set of generating monomials corresponding to said given block, and a modification of the current generating monomials set by concatenation with the determined generating monomials corresponding to said given block.

By virtue of the initial generating monomials set, a set of generating monomials corresponding to said given block are determined and the current generating monomials is modified by concatenation with the determined generating monomials corresponding to said given block.

In a further implementation form, the processing unit is further configured to determine the initial generating monomials set by using a predefined polar code of length 'N' and dimension 'K', having a predefined signal-to-noise ratio, the initial generating monomials set containing the 'K−1' most reliable monomials of the generating monomials set of the predefined polar code.

Beneficially, the most reliable monomials of the generating monomials set of the predefined polar code are included in the initial generating monomials set.

In a further implementation form, the processing unit is further configured to check, at each stage of the loop, the dimension of the modified current generating monomials set, and if said dimension is greater than 'K', stop the loop and restart the loop from the first block of the ordered blocks corresponding to the ordered block sizes in the profile, with a new initial generating monomials set.

By virtue of checking the dimension of the modified current generating monomials set, loop can be restarted with a new initial generating monomials set if the said dimension is greater than 'K'.

In a further implementation form, the processing unit is further configured to check, at the last stage of the loop, the dimension of the modified current generating monomials set, and if said dimension is equal to 'K', determine the generating monomials set as being the current generating monomials set; and if said dimension is not equal to 'K', stop the loop and restart the loop from the first block of the ordered blocks corresponding to the ordered block sizes in the profile, with a new initial generating monomials set.

By virtue of checking the dimension of the modified current generating monomials set, the generating monomials is determined as the current generating monomials set if the said dimension is equal to 'K'. Further, the loop is restarted from the first block of the ordered blocks with new initial generating monomials set if the said dimension is not equal to 'K'.

In a further implementation form, when the dimension of the modified current generating monomials set is greater than 1, the processing unit is further configured to determine the new initial generating monomials set by using a predefined polar code of length 'N' and having a new dimension equal to the previous dimension minus 1, and having the predefined signal-to-noise ratio, the initial generating monomials set containing a number of most reliable monomials of the generating monomials set of the predefined polar code corresponding to the new dimension minus 1; and when the dimension of the modified current generating monomials set is equal to 1, the processing unit is further configured to determine the new initial generating monomials set by using a predefined polar code of length 'N' and of dimension 'K', and having a new predefined signal-to-noise ratio corresponding to the previous predefined signal-to-noise ratio incremented by a given incremental value, the initial generating monomials set containing the 'K−1' most reliable monomials of the generating monomials set of the predefined polar code.

Beneficially, the running time can be reduced by early stopping the K' decrease by checking if the monomials to be added for next blocks are too many.

In another aspect, the present disclosure provides a communication device comprising an encoder for encoding an information word to be input into a communication channel, said encoder comprising an apparatus according to aforementioned aspect and a processor configured to generate a polar code codeword of the information word using the polar code associated with the frozen set generated by said apparatus.

By virtue of the communication device, redundancy is added to the data to be transmitted to securely and reliably transmit the data free of errors despite a noisy communication channel.

In yet another aspect, the present disclosure provides a method for generating a frozen set associated with a polar code of length 'N' and dimension 'K'. The frozen set is of size 'N−K' and comprises bit indices. The method comprises obtaining as an input the polar code length 'N', the dimension 'K', and a profile of a structure of a block lower triangular affine (BLTA) group. The said BLTA group structure is associated with an affine transformation matrix of size 'n×n'. The said profile is defined by an ordered set of a plurality of values corresponding to block sizes of a plurality of blocks. The said blocks are sub-matrices of said affine transformation matrix, all the diagonals of said blocks in the same order as the ordered plurality of block sizes, forming the diagonal of said affine transformation matrix, and each of the block sizes being such that 'n' is equal to the sum of said block sizes and 'n' is equal to $\log_2(N)$. The method further comprises generating the frozen set so that the associated polar code admits all affine automorphisms belonging to said BLTA group.

The method of the present disclosure provides an improved solution for generating a frozen set associated with a polar code such that it efficiently and reliably admits automorphisms belonging to a given block lower triangular affine (BLTA) group. Moreover, the polar codes are generated such that their automorphism group includes some elements of the upper triangular linear (UTL) group. Additionally, the polar codes are generated in such a way that they can be decoded under automorphism ensemble decoding using the desired permutations and exhibit lower latency and good block error rate (BLER) performance improvement compared to the conventional successive cancellation (SC) and successive cancellation list (SCL) decoding.

In an implementation form, the blocks are upper diagonal sub-matrices. Alternatively, the blocks can be permutation sub-matrices.

Beneficially, polar codes are generated such that their automorphism group includes some elements of the upper triangular linear (UTL) group.

In a further implementation form, the polar code is associated with a generating monomials set corresponding to an information set of size 'K', and the method further comprises generating said generating monomials set so that the associated polar code admits all the affine automorphisms belonging to the BLTA group, and generating the frozen set from the said generating monomials set.

By virtue of the generating monomials set, the polar code admits all the affine automorphisms belonging to the BLTA group.

In a further implementation form, the method further comprises determining an initial generating monomials set, defining a current generating monomial set as being the initial generating monomials set, and performing a loop, this loop comprising repeating, for each given block of the ordered blocks corresponding to the ordered block sizes in the profile: determining a set of generating monomials corresponding to said given block, and modifying the current generating monomials set by concatenation with the determined generating monomials corresponding to said given block.

By virtue of the initial generating monomials set, a set of generating monomials corresponding to said given block are determined and the current generating monomials is modified by concatenation with the determined generating monomials corresponding to said given block.

In a further implementation form, the method further comprises determining the initial generating monomials set by using a predefined polar code of length 'N' and dimension 'K', having a predefined signal-to-noise ratio, the initial generating monomials set containing the 'K–1' most reliable monomials of the generating monomials set of the predefined polar code.

Beneficially, the most reliable monomials of the generating monomials set of the predefined polar code are included in the initial generating monomials set.

In a further implementation form, the method further comprises checking, at each stage of the loop, the dimension of the modified current generating monomials set, and if said dimension is greater than 'K', stopping the loop and restarting the loop from the first block of the ordered blocks corresponding to the ordered block sizes in the profile, with a new initial generating monomials set.

By virtue of checking the dimension of the modified current generating monomials set, loop can be restarted with a new initial generating monomials set if the said dimension is greater than 'K'.

In a further implementation form, the method further comprises checking, at the last stage of the loop, the dimension of the modified current generating monomials set, and if said dimension is equal to 'K', determining the generating monomials set as being the current generating monomials set; and if said dimension is not equal to 'K', stopping the loop and restarting the loop from the first block of the ordered blocks corresponding to the ordered block sizes in the profile, with an new initial generating monomials set.

By virtue of checking the dimension of the modified current generating monomials set, the generating monomials is determined as the current generating monomials set if the said dimension is equal to 'K'. Further, the loop is restarted from the first block of the ordered blocks with a new initial generating monomials set if the said dimension is not equal to 'K'.

In a further implementation form, when the dimension of the modified current generating monomials set is greater than 1, the method further comprises determining the new initial generating monomials set by using a predefined polar code of length 'N' and having a new dimension equal to the previous dimension minus 1, and having the predefined signal-to-noise ratio, the initial generating monomials set containing a number of most reliable monomials of the generating monomials set of the predefined polar code corresponding to the new dimension minus 1; and when the dimension of the modified current generating monomials set is equal to 1, the method further comprises determining the new initial generating monomials set by using a predefined polar code of length 'N' and of dimension 'K', and having a new predefined signal-to-noise ratio corresponding to the previous predefined signal-to-noise ratio incremented by a given incremental value, the initial generating monomials set containing the 'K–1' most reliable monomials of the generating monomials set of the predefined polar code.

Beneficially, the running time can be reduced by early stopping the K' decrease by checking if the monomials to be added for next blocks are too many.

In yet another aspect, the present disclosure provides a computer program product comprising program code for performing the method of aforementioned aspect, when executed by a processor in a computer system.

The computer program product achieves all the advantages and effects of the respective method of the present disclosure.

It has to be noted that all devices, elements, circuitry, units and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof. It will be appreciated that features of the present disclosure are susceptible to being combined in various combinations without departing from the scope of the present disclosure as defined by the appended claims.

Additional aspects, advantages, features and objects of the present disclosure would be made apparent from the drawings and the detailed description of the illustrative implementations construed in conjunction with the appended claims that follow.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers. Embodiments of the present disclosure will now be described, by way of example only, with reference to the following diagrams wherein:

FIG. 2 is a flowchart for a method for generating a frozen set associated with a polar code, in accordance with an embodiment of the present disclosure;

FIG. 5 is a graphical representation that depicts block error rate performance for a polar code, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

Figure 1A:
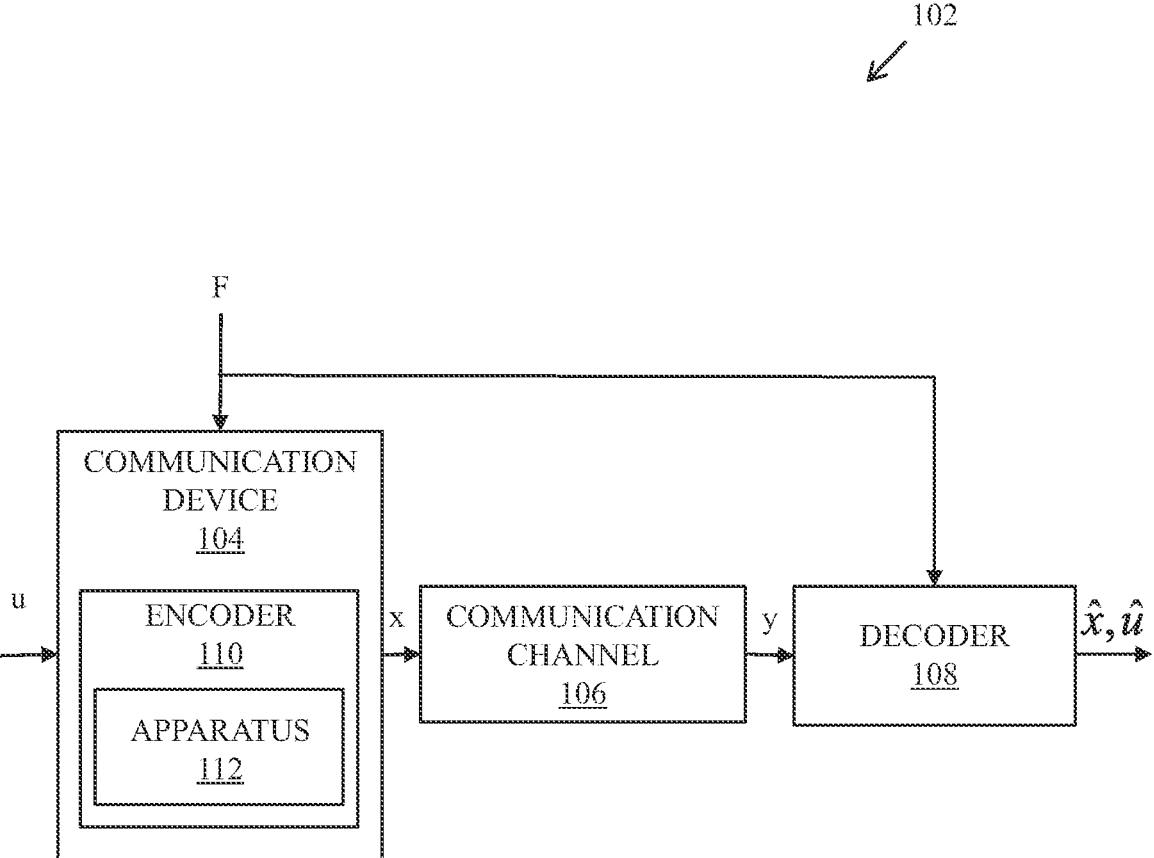
FIG. 1A is a block diagram of a communication system, in accordance with an embodiment of the present disclosure.

FIG. 1A is a block diagram of a communication system, in accordance with an embodiment of the present disclosure. With reference to FIG. 1A, there is shown a block diagram of a communication system 102. The communication system 102 includes a communication device 104, a communication channel 106, and a decoder 108. The communication device 104 further includes an encoder 110 comprising an apparatus 112.

The communication system 102 refers to a collection of individual telecommunications networks, transmission systems, relay stations, tributary stations, and terminal equipment usually capable of interconnection and interoperation to form an integrated whole. Further, the components of the communications system 102 serve a common purpose, are technically compatible, use common procedures, respond to controls, and operate in union. In an implementation, the communication system 102 corresponds to a digital communication system. Examples of the communication system 102 include, but are not limited to, radio communication system, power line communication systems, optical communication systems, or a cellular or other wireless communication systems, such as 5G communication system, and the alike.

The communication device 104 refers to a device used at the transmitter side of the communication system 102 to encode the data such that the receiver obtains the transmitted data free of errors despite the noisy communication channel. The communication device 104 includes suitable logic, circuitry, interfaces, and/or code that is configured to efficiently and reliably generate polar codes. The communication device 104 is described in detail in FIG. 1B.

The communication channel 106 refers either to a physical transmission medium such as a wire, or to a logical connection over a multiplexed medium such as a radio channel in telecommunications and computer networking. In information theory, the communication channel 106 refers to a theoretical channel model with certain error characteristics. The communication channel 106 is used to convey an information signal, for example a digital bit stream, from one or several senders (or transmitters) to one or several receivers. Examples of the communication channel 106 include, but are not limited to, binary asymmetric channel, binary symmetric channel (BSC), binary bursty bit error channel, binary erasure channel (BEC), packet erasure channel, arbitrarily varying channel (AVC), and the alike.

The decoder 108 refers to a device at the receiver side of the communication system 102 which produces estimates of the transmitted codeword and the transmitted data. Alternatively stated, the decoder 108 translates or maps received messages into codewords of a given code. Hence, the decoder 108 is used to recover messages sent over a noisy channel, such as a binary symmetric channel. Examples of the decoder 108 include, but are not limited to, Viterbi decoder, maximum likelihood decoder, syndrome decoder, partial response maximum likelihood decoder, and the alike.

The encoder 110 refers to a device used at the transmitter side of the communication system 102 which adds redundancy to the data to be transmitted, i.e., additional redundant data. The encoder 110 includes suitable logic, circuitry, interfaces, and/or code that is configured to efficiently and reliably encode the data into codeword. The set of possible codewords refer to a channel code or simply a code. Examples of the codes include, but are not limited to, polar codes, Reed-Muller codes, Reed-Solomon codes, hamming codes, Hadamard codes, and many more.

The apparatus 112 refers to a device used for generating a frozen set associated with a polar code. The apparatus 112 obtain as an input the polar code length 'N', the dimension 'K', and a profile of a structure of a block lower triangular affine (BLTA) group to generate the frozen set so that the associated polar code admits all the affine automorphisms belonging to said BLTA group. In an implementation, the apparatus 112 may be a part of the encoder 110. In another implementation, the apparatus 112 may be implemented as the encoder 110 itself.

Figure 1B:
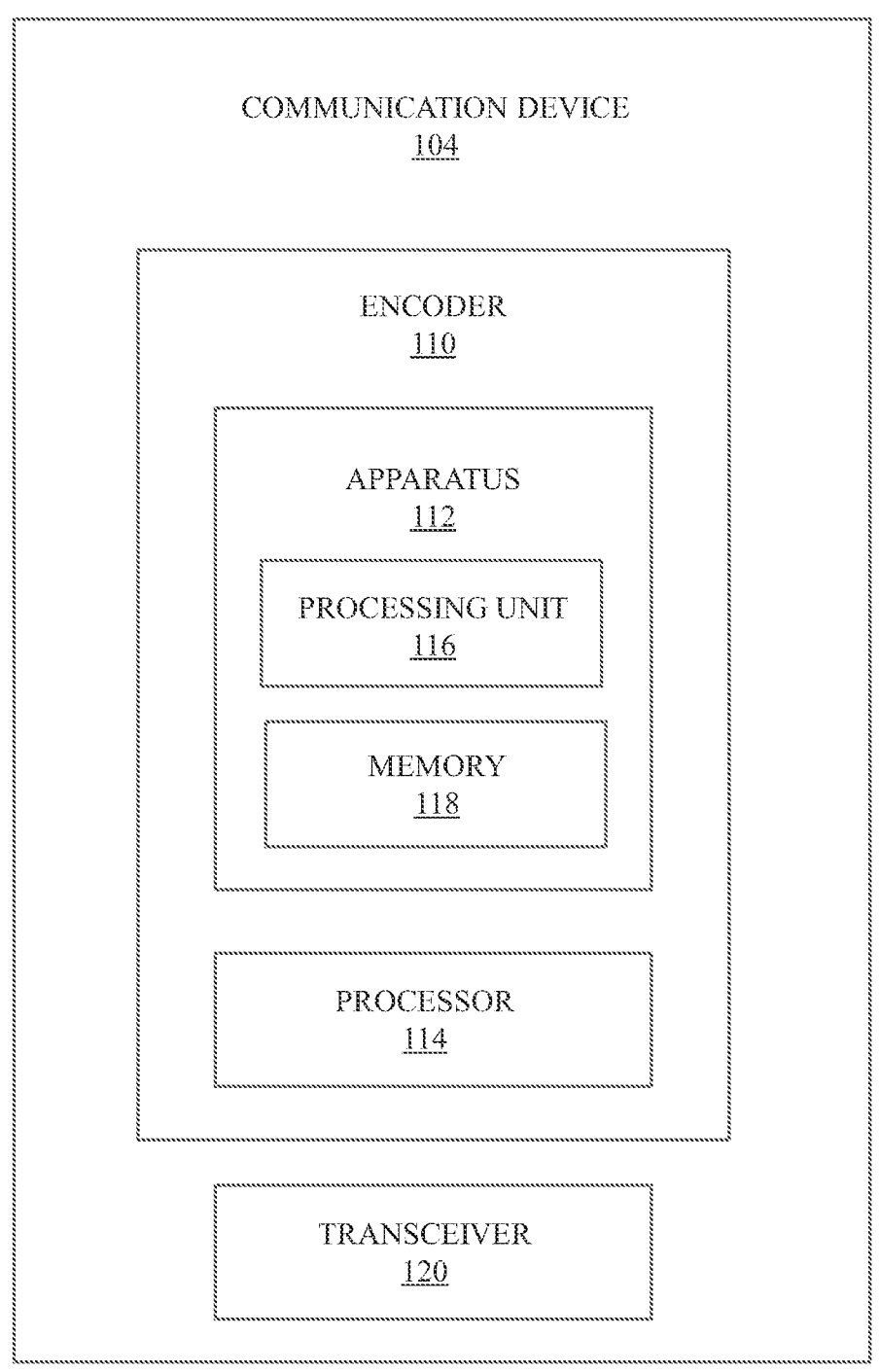
FIG. 1B is a block diagram that illustrates various exemplary components of a communication device, in accordance with an embodiment of the present disclosure.

FIG. 1B is a block diagram that illustrates various exemplary components of a communication device, in accordance with an embodiment of the present disclosure. FIG. 1B is described in conjunction with elements from FIG. 1A. With reference to FIG. 1B, there is shown a block diagram of the communication device 104. The communication device 104 includes the encoder 110. The encoder 110 further includes the apparatus 112 and a processor 114. The apparatus 112 further includes a processing unit 116 and a memory 118.

There is further shown a transceiver 120. In this implementation, the apparatus 112 is a part of the encoder 110. However, it is to be understood that the apparatus 112 may be implemented as the encoder 110 itself. In such a case, the functions of the processor 114 and the processing unit 116 can be performed by a single processor.

The processor 114 include a suitable logic circuitry that may be configured to generate a polar code codeword of the information word using the polar code associated with the frozen set generated by the encoder 110. Examples of the processor 114 may include, but are not limited to, a microprocessor, a microcontroller, a complex instruction set computing (CISC) processor, an application-specific integrated circuit (ASIC) processor, a reduced instruction set (RISC) processor, a very long instruction word (VLIW) processor, a central processing unit (CPU), a state machine, a data processing unit, and other processors or control circuitry. In an implementation, the operations executed by the encoder 110 may be executed and controlled by the processor 114.

The processing unit 116 include a suitable logic circuitry that may be configured to generate a frozen set associated with a polar code for a given block lower triangular affine (BLTA) group. Examples of the processing unit 116 may include, but are not limited to, a microprocessor, a microcontroller, a complex instruction set computing (CISC) processor, an application-specific integrated circuit (ASIC) processor, a reduced instruction set (RISC) processor, a very long instruction word (VLIW) processor, a central processing unit (CPU), a state machine, a data processing unit, and other processors or control circuitry. In an implementation, the operations executed by the apparatus 112 may be executed and controlled by the processing unit 116.

The memory 118 include suitable logic, circuitry, and/or interfaces that may be configured to store machine code and/or instructions executable by the apparatus 112. Examples of implementation of the memory 118 may include, but are not limited to, Random Access Memory (RAM), Hard Disk Drive (HDD), Flash memory, Solid-state Drive (SSD), and/or CPU cache memory.

The transceiver 120 of the communication device 104, includes suitable logic, circuitry, and/or interfaces that is configured to transmit or receive the data. Examples of the transceiver 120 include, but are not limited to, a transmitter/receiver antenna, an Internet-of-Things (IOT) controller, a network interface, a customized hardware for wireless telecommunication, or the alike.

In operation, the apparatus 112 generates a frozen set associated with a polar code of length 'N' and dimension 'K', the frozen set being of size 'N−K' and comprises bit indices. The polar codes refer to linear block codes that rely on the polarization effect, which allows to sort the bit positions of bit-channels, in order of reliability. The polar encoding process consists the classification of the bit-channels in the data 'u' (i.e., the data to be transmitted) into two groups. The first group consists of the 'K' good bit-channels that carry the information bits and are indexed by the information set 'I', the second group consists of the 'N−K' bad bit-channels that are fixed to a predefined value (usually 0) and are indexed by the frozen set 'F'. In case of finite code lengths, the 'K' best bit-channels, i.e., the ones with the highest reliability, are selected to form the information set, while the remaining bit-channels are frozen to the frozen set 'F'. Further, the polar codes are based on the kernel matrix $$T_2 = \begin{bmatrix} 1 & 0 \\ 1 & 1 \end{bmatrix}.$$

Encoding of such a polar code of length 'N', where $N=2^n$, and dimension, also called information length, 'K' is done such that the bits '$u_i$' of the input vector 'u' are set to 0 for $i \in F$ and to the information bits otherwise. The codeword 'x' is computed as x=uT with the channel transformation matrix $T=T_2^{\otimes n}$, denoting the n-fold Kronecker product.

The apparatus 112 comprises a processing unit 116 configured to obtain as an input the polar code length 'N', the dimension 'K', and a profile of a structure of a block lower triangular affine (BLTA) group. The said BLTA group structure is associated with an affine transformation matrix of size 'n×n'. The said profile is defined by an ordered set of a plurality of values corresponding to block sizes of a plurality of blocks. The said blocks are sub-matrices of said affine transformation matrix with all the diagonals of said blocks in the same order as the ordered plurality of block sizes, forming the diagonal of said affine transformation matrix, each of the block sizes is such that 'n' is equal to the sum of said block sizes and 'n' is equal to $\log_2(N)$. The block lower triangular affine (BLTA) group, which is represented as BLTA (s, n), refers to a set of affine transformations x'=Ax+b, where 'A' is a non-singular block lower-triangular with block structure $s=[s_1, \ldots, s_r]$ with $s_1+\ldots+s_r=n$ and 'b' is a binary column of length 'n'.

The processing unit 116 is further configured to generate the frozen set so that the associated polar code admits all the affine automorphisms belonging to said BLTA group. The automorphism 'x' of a code 'C' maps any codeword $x \in C$ into another codeword $\pi(x) \in C$. The automorphism group 'Aut (C)' of the code 'C' refers to the set containing all the automorphisms of the code 'C'. The nature of the automorphism group of polar code is in general not known, however their decreasing monomial code description permits to find a subgroup of the automorphism group of the code. The one of its sub-groups is referred to as the group of lower-triangular affine (LTA) transformation of order 'n', which is represented as LTA (n). The LTA (n) is contained in GA (n), which is a sub-group of the automorphism group of a decreasing monomials code. The LTA (n) group can be defined similarly to GA (n), where the affine transformation matrix 'A' is a lower triangular with full diagonal. Since well-designed polar codes are also decreasing monomials codes, then LTA (n) is a sub-group of the automorphism group of polar codes.

In accordance with an embodiment, the blocks are upper diagonal sub-matrices. The polar codes are designed such that their automorphism group includes some elements of the upper triangular linear (UTL) group of order 'n', namely UTL (n), that is described by the group of all the upper diagonal binary matrices of size n×n. The elements of the UTL group corresponds to the elements of the upper diagonal sub-matrices. Further, the elements of UTL must belong to the BLTA structure provided in input.

In accordance with an embodiment, the polar code is associated with a generating monomials set corresponding to an information set of size 'K', and the processing unit 116 is further configured to generate said generating monomials set so that the associated polar code admits all the affine automorphisms belonging to the BLTA group, and to generate the frozen set from the said generating monomials set. Monomial codes are a family of codes of length $N=2^n$ that can be obtained as evaluations of Boolean functions, namely as polynomials in $F_2[x_0, \ldots, x_{n-1}]$. The monomial code of length $N=2^n$ and dimension 'K' is generated by picking 'K' monomials out of the 'N' to generate the code space. The 'K' chosen monomials are referred to as the generating monomials set and the evaluation of their linear combinations provides the codebook of the code. For monomial codes, the monomial set '$\mathcal{M}$', containing the generating monomials, is equivalent to the information set 'I' of polar codes. The minimum distance of the monomial code is given by $2^{n-d_{max}}$, where $d_{max}$ represent the highest degree of monomials in '$\mathcal{M}$'. Further, the monomial code is decreasing if for every monomial in the generating monomial set all its monomial factor belong to the set. Further, the rows of the affine transformation matrix of the polar code represent all possible evaluations of monomials over $F_2$. Hence, the polar codes are determined by picking monomials according to polarization effect, i.e., if the polar code design is compliant with the universal partial order framework, the resulting code is a decreasing monomial code.

In accordance with an embodiment, the processing unit 116 is further configured to determine an initial generating monomials set, to define a current generating monomial set as being the initial generating monomials set, and to perform a loop repeating, for each given block of the ordered blocks corresponding to the ordered block sizes in the profile: determination of a set of generating monomials corresponding to said given block, modification of the current generating monomials set by concatenation with the determined generating monomials corresponding to said given block. In order to find a possible polar code filing the BLTA pattern, two loops are run. The first loop is on the design signal-to-noise ratio (SNR) of the pre-defined code. Alternatively stated, the first loop defines the design SNR used to sort the monomials in reliability order according to differential evolution/genetic algorithm (DE/GA) method. In case of failure, the procedure is repeated for another design SNR. Further, the algorithm fails when a threshold design SNR is reached without an acceptable monomial set.

In accordance with an embodiment, the processing unit 116 is further configured to determine the initial generating monomials set by using a predefined polar code of length 'N' and dimension 'K', having a predefined signal-to-noise ratio, the initial generating monomials set containing the 'K−1' most reliable monomials of the generating monomials set of the predefined polar code. The K'=K−1 most reliable monomials are used to create the initial monomial set '$\mathcal{M}$' of the code. Further, the second loop increases the number of monomials in the monomial set of the code starting from a given starting dimension K' until $|\mathcal{M}|$=K and the desired 's' is obtained.

In accordance with an embodiment, the processing unit 116 is further configured to check, at each stage of the loop, the dimension of the modified current generating monomials set, and if said dimension is greater than 'K', to stop the loop and restart it from the first block of the ordered blocks corresponding to the ordered block sizes in the profile, with a new initial generating monomials set. An auxiliary matrix $A_{\mathcal{M}}$ of size n×n representing the monomials needed to be added to '$\mathcal{M}$' is used in order to free a certain position (i, j) in the matrix 'A'. Non-zero entries of 'A' represent variable changes. For example, setting A (i, j)=1 means to substitute variable $x_i$ with variable $x_j$. Further, A (i, j) can be set to 1 only if the variable change does not impact the generating monomial set. Hence, if A (i, j) cannot be set to 1, $A_{\mathcal{M}}$ (i, j) stores the monomial required to be added in the monomial by checking the variable changes implied by the index.

In accordance with an embodiment, the processing unit 116 is further configured to check, at the last stage of the loop, the dimension of the modified current generating monomials set, and if said dimension is equal to 'K', to determine the generating monomials set as being the current generating monomials set; and if said dimension is not equal to 'K', to stop the loop restart it from the first block of the ordered blocks corresponding to the ordered block sizes in the profile, with a new initial generating monomials set. The processing unit 116 proceeds in block order, i.e., from $s_1$ to $s_t$. For instance, the processing unit 116 focuses on the top left of matrix 'A', adding the monomials listed in $A_{\mathcal{M}}$ in order to match the desired first block dimension $s_1$. This addition can also be performed column by column and updating $A_{\mathcal{M}}$ after each unlocked column to increase the success probability of the algorithm. After the inclusion of all the monomials, a check on the size of '$\mathcal{M}$' is performed. If $|\mathcal{M}|$<K, the processing unit 116 keeps '$\mathcal{M}$' and proceeds to the next block, otherwise the processing unit 116 restarts the procedure by setting K'=K'−1. At block $s_i$, the procedure is repeated, namely the auxiliary matrix $A_{\mathcal{M}}$ is calculated on the basis of the monomial set '$\mathcal{M}$' calculated for the previous block. All the monomials corresponding to block $s_i$ are added to '$\mathcal{M}$' (eventually, column by column) and its size is checked. If $|\mathcal{M}|$<K, the processing unit 116 proceeds to next block, otherwise the processing unit 116 restarts the procedure from the first block with K'=K'−1.

In accordance with an embodiment, when the dimension of the modified current generating monomials set is greater than 1, the processing unit 116 is further configured to determine the new initial generating monomials set by using a predefined polar code of length 'N' and having a new dimension equal to the previous dimension minus 1, and having the predefined signal-to-noise ratio, the initial generating monomials set containing a number of most reliable monomials of the generating monomials set of the predefined polar code corresponding to the new dimension minus 1; and when the dimension of the modified current generating monomials set is equal to 1, the processing unit 116 is further configured to determine the new initial generating monomials set by using a predefined polar code of length 'N' and of dimension 'K', and having a new predefined signal-to-noise ratio corresponding to the previous predefined signal-to-noise ratio incremented by a given incremental value, the initial generating monomials set containing the 'K−1' most reliable monomials of the generating monomials set of the predefined polar code. When K'=0, a new signal-to-noise ratio (SNR) designed is calculate by increasing the old design SNR of 0.5 dB and the procedure is restarted setting K'=K−1. The processing unit 116 ends the procedure successfully if $|\mathcal{M}|$=K at the check of the last block 't', and the information set corresponding to the monomial set '$\mathcal{M}$' is provided as output by the processing unit 116.

Thus, the present disclosure provides a communication device 104 comprising an encoder 110 for encoding an information word to be input into a communication channel 106, said encoder 110 comprising an apparatus 112 according to aforementioned aspect and a processor 114 configured to generate a polar code codeword of the information word using the polar code associated with the frozen set generated by said apparatus 112. Thus, the apparatus 112 provides an improved solution for generating a frozen set associated with a polar code such that it efficiently and reliably admits automorphisms belonging to a given block lower triangular affine (BLTA) group. Moreover, the polar codes are generated such that their automorphism group includes some elements of the upper triangular linear (UTL) group. Additionally, the polar codes are generated in such a way that they can be decoded under automorphism ensemble decoding using the desired permutations and exhibit lower latency and good block error rate (BLER) performance improvement compared to the conventional successive cancellation (SC) and successive cancellation list (SCL) decoding.

FIG. 2 is a flowchart for a method for generating a frozen set associated with a polar code, in accordance with an embodiment of the present disclosure. FIG. 2 is described in conjunction with elements of FIGS. 1A and 1B. with reference to FIG. 2, there is shown a method 200 for generating a frozen set associated with a polar code. The method 200 includes the step 202 and 204. The method 200 is executed by the apparatus 112 described, for example, in FIG. 1B.

At step 202, the method 200 comprises taking in input the polar code length 'N', the dimension 'K', and a profile of a structure of a block lower triangular affine (BLTA) group. The said BLTA group structure is associated with an affine transformation matrix of size 'N×N'. The said profile is defined by an ordered set of a plurality of values corresponding to block sizes of a plurality of blocks. The said blocks are sub-matrices of said affine transformation matrix with all the diagonals of said blocks in the same order as the ordered plurality of block sizes, forming the diagonal of said affine transformation matrix, each of the block sizes being such that 'n' is equal to the sum of said block sizes and 'n' is equal to $\log_2(N)$. The block lower triangular affine (BLTA) group, which is represented as BLTA (s, n), refers to a set of affine transformations x'=Ax+b, where 'A' is a non-singular block lower-triangular with block structure s=[$s_1$, . . . , $s_t$] with $s_1$+ . . . +$s_t$=n and 'b' is a binary column of length 'n'.

At step 204, the method 200 further comprises generating the frozen set so that the associated polar code admits all the affine automorphisms belonging to said BLTA group. The automorphism 'π' of a code 'C' maps any codeword x∈C into another codeword π(x)∈C. The automorphism group 'Aut (C)' of the code 'C' refers to the set containing all the automorphisms of the code 'C'. The nature of the automorphism group of polar code is in general not known, however their decreasing monomial code description permits to find a subgroup of the automorphism group of the code. The one of its sub-groups is referred to as the group of lower-triangular affine (LTA) transformation of order 'n', which is represented as LTA (n). The LTA (n) is contained in GA (n), which is a sub-group of the automorphism group of a decreasing monomials code. The LTA (n) group can be defined similarly to GA (n), where the affine transformation matrix 'A' is a lower triangular with full diagonal. Since well-designed polar codes are also decreasing monomials codes, then LTA (n) is a sub-group of the automorphism group of polar codes.

In accordance with an embodiment, the blocks are upper diagonal sub-matrices. The polar codes are designed such that their automorphism group includes some elements of the upper triangular linear (UTL) group of order 'n', namely UTL (n), that is described by the group of all the upper diagonal binary matrices of size n×n. The elements of the UTL group corresponds to the elements of the upper diagonal sub-matrices. Further, the elements of UTL must belong to the BLTA structure provided in input.

In accordance with an embodiment, the polar code is associated with a generating monomials set corresponding to an information set of size 'K', and the method further comprises generating said generating monomials set so that the associated polar code admits all the affine automorphisms belonging to the BLTA group, and generating the frozen set from the said generating monomials set. For monomial codes, the monomial set '$\mathcal{M}$', containing the generating monomials, is equivalent to the information set 'I' of polar codes. The minimum distance of the monomial code is given by $2^{n-d_{max}}$, where $d_{max}$ represent the highest degree of monomials in '$\mathcal{M}$'. Further, the monomial code is decreasing if for every monomial in the generating monomial set all its monomial factor belong to the set. Further, the rows of the affine transformation matrix of the polar code represent all possible evaluations of monomials over $F_2$. Hence, the polar codes are determined by picking monomials according to polarization effect, i.e., if the polar code design is compliant with the universal partial order framework, the resulting code is a decreasing monomial code.

In accordance with an embodiment, the method 200 further comprises determining an initial generating monomials set, defining a current generating monomial set as being the initial generating monomials set, and performing a loop repeating, for each given block of the ordered blocks corresponding to the ordered block sizes in the profile: determining a set of generating monomials corresponding to said given block, modifying the current generating monomials set by concatenation with the determined generating monomials corresponding to said given block. In order to find a possible polar code filing the BLTA pattern, two loops are run. The first loop is on the design signal-to-noise ratio (SNR) of the pre-defined code. Alternatively stated, the first loop defines the design SNR used to sort the monomials in reliability order according to differential evolution/genetic algorithm (DE/GA) method. In case of failure, the procedure is repeated for another design SNR. Further, the algorithm fails when a threshold design SNR is reached without an acceptable monomial set.

In accordance with an embodiment, the method 200 further comprises determining the initial generating monomials set by using a predefined polar code of length 'N' and dimension 'K', having a predefined signal-to-noise ratio, the initial generating monomials set containing the 'K−1' most reliable monomials of the generating monomials set of the predefined polar code. The K'=K−1 most reliable monomials are used to create the initial monomial set '$\mathcal{M}$' of the code. Further, the second loop increases the number of monomials in the monomial set of the code starting from a given starting dimension K' until |$\mathcal{M}$|=K and the desired 's' is obtained.

In accordance with an embodiment, the method 200 further comprises checking, at each stage of the loop, the dimension of the modified current generating monomials set, and if said dimension is greater than 'K', stopping the loop and restarting it from the first block of the ordered blocks corresponding to the ordered block sizes in the profile, with a new initial generating monomials set. An auxiliary matrix $A_{\mathcal{M}}$ of size n×n representing the monomials needed to be added to '$\mathcal{M}$' is used in order to free a certain position (i, j) in the matrix 'A'. Non-zero entries of 'A' represent variable changes. For example, setting A (i, j)=1 means to substitute variable $x_i$ with variable $x_j$. Further, A (i, j) can be set to 1 only if the variable change does not impact the generating monomial set. Hence, if A (i, j) cannot be set to 1, $A_{\mathcal{M}}$ (i, j) stores the monomial required to be added in the monomial by checking the variable changes implied by the index.

In accordance with an embodiment, the method 200 further comprises checking, at the last stage of the loop, the dimension of the modified current generating monomials set, and if said dimension is equal to 'K', determining the generating monomials set as being the current generating monomials set; and if said dimension is not equal to 'K', stopping the loop restarting it from the first block of the ordered blocks corresponding to the ordered block sizes in the profile, with an new initial generating monomials set.

The method 200 proceeds in block order, i.e., from $s_1$ to $s_t$. For instance, the method 200 focuses on the top left of matrix 'A', adding the monomials listed in $A_{\mathcal{M}}$ in order to match the desired first block dimension $s_1$. This addition can also be performed column by column and updating $A_{\mathcal{M}}$ after each unlocked column to increase the success probability of the algorithm. After the inclusion of all the monomials, a check on the size of '$\mathcal{M}$' is performed. If | $\mathcal{M}$ |<K, the method 200 keeps '$\mathcal{M}$' and proceeds to the next block, otherwise the method 200 restarts the procedure by setting K'=K'−1. At block $s_i$, the procedure is repeated, namely the auxiliary matrix $A_{\mathcal{M}}$ is calculated on the basis of the monomial set '$\mathcal{M}$' calculated for the previous block. All the monomials corresponding to block $s_i$ are added to '$\mathcal{M}$' (eventually, column by column) and its size is checked. If | $\mathcal{M}$ |<K, the method 200 proceeds to next block, otherwise the method 200 restarts the procedure from the first block with K'=K'−1.

In accordance with an embodiment, when the dimension of the modified current generating monomials set is greater than 1, the method 200 further comprises determining the new initial generating monomials set by using a predefined polar code of length 'N' and having a new dimension equal to the previous dimension minus 1, and having the predefined signal-to-noise ratio, the initial generating monomials set containing a number of most reliable monomials of the generating monomials set of the predefined polar code corresponding to the new dimension minus 1; and when the dimension of the modified current generating monomials set is equal to 1, the method 200 further comprises determining the new initial generating monomials set by using a predefined polar code of length 'N' and of dimension 'K', and having a new predefined signal-to-noise ratio corresponding to the previous predefined signal-to-noise ratio incremented by a given incremental value, the initial generating monomials set containing the 'K−1' most reliable monomials of the generating monomials set of the predefined polar code. When K'=0, a new signal-to-noise ratio (SNR) designed is calculate by increasing the old design SNR of 0.5 dB and the procedure is restarted setting K'=K−1. The method 200 ends the procedure successfully if | $\mathcal{M}$ |=K at the check of the last block 't', and the information set corresponding to the monomial set '$\mathcal{M}$' is provided as output by the method 200.

The steps 202 and 204 are only illustrative and other alternatives can also be provided where one or more steps are added, one or more steps are removed, or one or more steps are provided in a different sequence without departing from the scope of the claims herein.

Thus, the method 200 uses the apparatus 112 to generate a frozen set associated with a polar code such that it efficiently and reliably admits automorphisms belonging to a given block lower triangular affine (BLTA) group. Moreover, the polar codes are generated such that their automorphism group includes some elements of the upper triangular linear (UTL) group.

Additionally, the polar codes are generated in such a way that they can be decoded under automorphism ensemble decoding using the desired permutations and exhibit lower latency and good block error rate (BLER) performance improvement compared to the conventional successive cancellation (SC) and successive cancellation list (SCL) decoding.

In yet another aspect, the present disclosure provides a computer program product comprising program code for performing the method 200 of aforementioned aspect, when executed by a processor in a computer system. The computer program product refers to a non-transitory computer-read-able storage medium. Examples of implementation of the computer program product include, but are not limited to, Electrically Erasable Programmable Read-Only Memory (EEPROM), Random Access Memory (RAM), Read Only Memory (ROM), Hard Disk Drive (HDD), Flash memory, a Secure Digital (SD) card.

Figure 3:
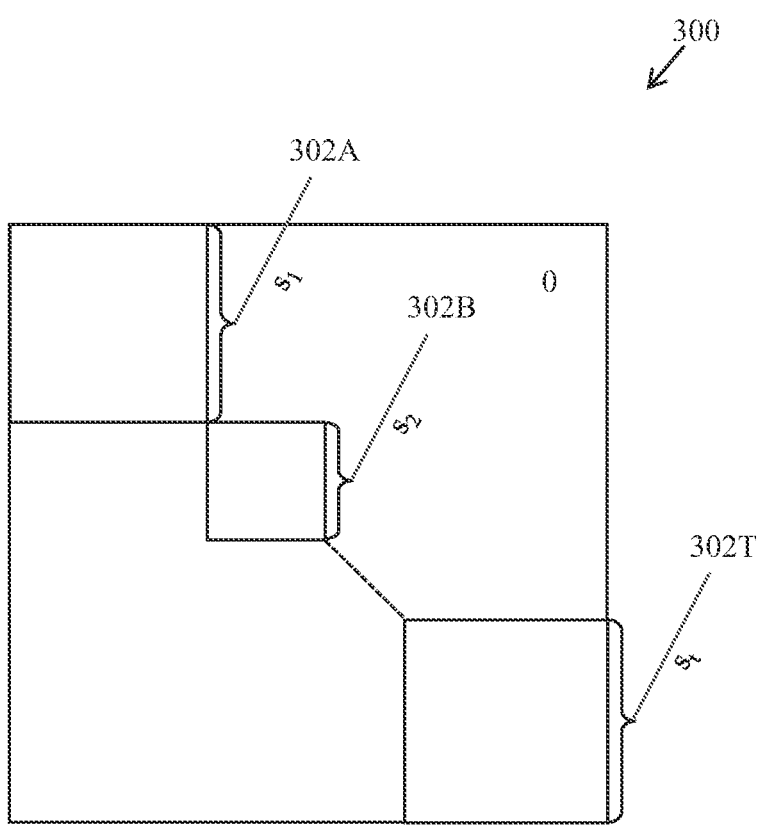
FIG. 3 is an exemplary illustration that depicts structure of a non-singular block lower triangular affine, in accordance with an embodiment of the present disclosure.

FIG. 3 is an exemplary illustration that depicts structure of a non-singular block lower triangular affine, in accordance with an embodiment of the present disclosure. FIG. 3 is described in conjunction with elements of FIGS. 1A, 1B, and 2. With reference to FIG. 3, there is shown a block structure of a block lower triangular affine (BLTA) group 300. There is further shown elements of the block structure, namely a first element 302A ($s_1$), a second element 302B ($s_2$), up to a Tth element 302T ($s_t$).

The block lower triangular affine (BLTA) group 300, which is represented as BLTA (s, n) corresponds to a set of affine transformations x'=Ax+b, where 'A' is a non-singular block lower triangular with block structure s=[$s_1$, . . . , $s_t$] with $s_1$+ . . . +$s_t$=n. For a polar code generated according to universal partial order (UPO) framework, the block structure of the block lower triangular affine (BLTA) group 300 fully describes the sub-group of the automorphism group of the code that can be described through affine transformations. The apparatus 112 and the method 200 of the present disclosure provides a solution to calculate the block lower triangular affine (BLTA) group 300 for a given polar code, as well as, create a polar code with a given BLTA group. Hence, the polar codes can be designed based on the basis of the required block lower triangular affine (BLTA) group 300.

Figure 4:
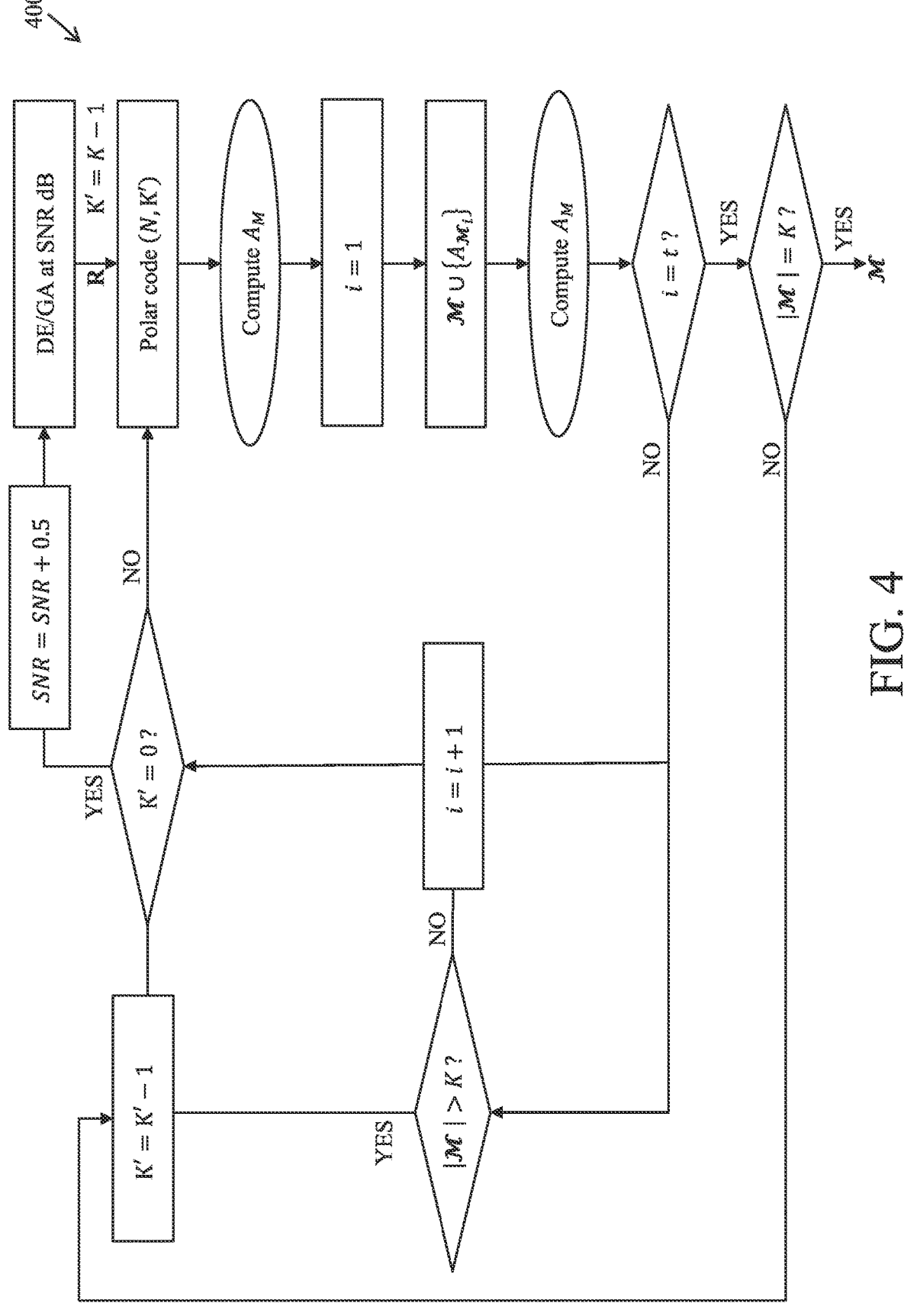
FIG. 4 is an exemplary process diagram that depicts a process for generation of a frozen set associated with a polar code, in accordance with an embodiment of the present disclosure.

FIG. 4 is an exemplary process diagram that depicts a process for generation of a frozen set associated with a polar code, in accordance with an embodiment of the present disclosure. FIG. 4 is described in conjunction with elements from FIGS. 1A, 1B, 2, and 3. With reference to FIG. 4, there is shown a process diagram 400 that depicts a process for generation of a frozen set associated with a polar code. The generation of the frozen set associated with the polar code is performed by the apparatus 112 (of FIG. 1B) according to the method 200 (of FIG. 2).

The process diagram 400 attempts to create a polar code of length $N=2^n$ and dimension K allowing a block-lower-triangular (BLT) affine transformation matrix A used in the affine transformation π=Ax+b, where b is a binary column of length n. The affine transformation computes every possible affine automorphisms of the given polar code. If the process does not find a polar code with the wanted BLT pattern, the process returns a failure. The BLT matrix is described with the size set s representing the dimension of every block on the diagonal. As a consequence, the sum of every element in s is n. For instance, a polar code of length N=1024 with s=[4, 3, 3] allow a first 4×4 block then two 3×3 blocks. A large last block enhances the automorphism decoding but it is difficult to design such a code. In the opposite, the first block impact is not huge in automorphism ensemble (AE) decoding but it is easier to design a polar code with a large first block.

The process requires four parameters: polar code length N, polar code dimension K, block structure profile s=[$s_1$, . . . , $s_t$], and starting design signal-to-noise-ratio (SNR) input_SNR. In order to find a possible polar code filing the BLT pattern, two loops are run. The first loop is on the design SNR of the pre-defined code. The second loop decreases the number of monomials to be picked until reaching a certain dimension where the design is known to fail.

The first loop defines the design SNR used to sort the monomials in reliability order according to differential evolution/genetic algorithm (DE/GA) method and the second loop increases the number of monomials in the monomial set of the code starting from a given starting dimension K' until $|\mathcal{M}|$=K and the desired s is obtained. In case of failure, the procedure is repeated for another design SNR. The process fails when a threshold design SNR is reached without an acceptable monomial set.

The process uses an auxiliary matrix $A_{\mathcal{M}}$ of size n×n representing the monomials needed to be added to M in order to free a certain position (i,j) in the matrix A. Non-zero entries of A represent variable changes. For instance, setting A(i,j)=1 means to substitute variable $x_i$ with variable $x_j$. A(i,j) can be set to 1 only if the variable change does not impact the generating monomial set. Further, if A(i,j) cannot be set to 1, $A_{\mathcal{M}}$ (i,j) stores the monomial required to be added in the monomial by checking the variable changes implied by the index. The pre-defined code is designed using DE/GA method at SNR=input_SNR to sort the monomials in reliability order. Next, the K'=K−1 most reliable monomials are used to create the initial monomial set $\mathcal{M}$ of the code. Then, the previously described step allowing to generate auxiliary matrix $A_{\mathcal{M}}$ is executed.

The process proceeds in block order, i.e., from $s_1$ to $s_t$. To begin with, the process focuses on the top left of matrix A, adding the monomials listed in $A_{\mathcal{M}}$ in order to match the desired first block dimension $s_1$. This addition can also be performed column by column and updating $A_{\mathcal{M}}$ after each unlocked column to increase the success probability of the process. After the inclusion of all these monomials, a check on the size of $\mathcal{M}$ is performed. If $|\mathcal{M}|$<K, the process keeps $\mathcal{M}$ and proceeds to the next block; otherwise, the procedure is restarted by setting K'=K'−1. At block $s_i$, the procedure is repeated, i.e., the auxiliary matrix $A_{\mathcal{M}}$ is calculated on the basis of the monomial set $\mathcal{M}$ calculated for the previous block, all the monomials corresponding to block $s_i$ are added to $\mathcal{M}$ (eventually, column by column) and its size is checked. If $|\mathcal{M}|$<K, the process proceeds to next block, otherwise the procedure restarts from the first block with K'=K'−1.

When K'=0, a new SNR designed is calculate by increasing the old design SNR (e.g., 0.5 dB) and the procedure is restarted setting K'=K−1. The process ends successfully if $|\mathcal{M}|$=K at the check of the last block t, and the information set corresponding to the monomial set $\mathcal{M}$ is provided as output by the process. If the design SNR reaches a threshold value (e.g., 10 dB), the process fails.

The running time of the process can be reduced by early stopping the K' decrease by checking if the monomials to be added for next blocks are too many. In fact, $A_{\mathcal{M}}$ can only provide monomial to pick with degree that are lower or equal to the maximum degree already located in the generating monomial set. Since the number of monomials up to a degree d is represented by $$\sum_{k=0}^{d} \binom{n}{k},$$

if $d_{max}$ is the largest degree present in $\mathcal{M}$, then $A_{\mathcal{M}}$ can provide enough monomials to reach the desired dimension K if and only if $$\sum_{k=0}^{d_{max}} \binom{n}{k} < K.$$

This property can be used to early terminate the process, making it restart from next design SNR without reaching K'=0.

FIG. 5 is a graphical representation that depicts block error rate performance for a polar code, in accordance with an embodiment of the present disclosure. FIG. 5 is described in conjunction with elements from FIGS. 1A, 1B, 2, 3, and 4. With reference to FIG. 5, there is shown a graphical representation 500 that depicts block error rate (BLER) performance for a polar code generated by the apparatus 112 (of FIG. 1B) under automorphism ensemble (AE) decoding. There is further shown a comparison with the conventional successive cancellation (SC) decoding. There is further shown BLER performance of a 5G polar code of the same length and dimension under the conventional successive cancellation list (SCL) decoding.

The results of the graphical representation 500 refer to the BLER performance of a code designed using the method 200 (of FIG. 2) to create a polar code with a given BLTA profile. A (1024, 504) polar code has been designed according to the method 200 (of FIG. 2) to admit different profiles. Further, three polar codes are designed according to three different profiles, each one leading to a different information set.

The graphical representation 500 represents $E_s/N_0$ in decibels (dB) on an X-axis 502 and values of block error rate (BLER) on a Y-axis 504. A first line 506 (a dashed line with square markers) represents BLER performance of the 5G polar code. A second line 508 (a dashed line with circle markers) represents BLER performance of AE decoding with block structure profile s=[4, 3, 3]. A third line 510 (a dashed line with cross markers) represents BLER performance of AE decoding with block structure profile s=[3, 1, 2, 1, 2]. A fourth line 512 (a dashed line with asterisk markers) represents BLER performance of AE decoding with block structure profile s=[4, 1, 1, 1, 1, 1, 1]. A fifth line 514 (a solid line with asterisk markers) represents BLER performance of the conventional SC decoding with block structure profile s=[4, 1, 1, 1, 1, 1, 1]. A sixth line 516 (a solid line with cross markers) represents BLER performance of the conventional SC decoding with block structure profile s=[3, 1, 2, 1, 2]. A seventh line 518 (a solid line with circle markers) represents BLER performance of the conventional SC decoding with block structure profile s=[4, 3, 3]. Further, the information set resulting from the block structure profile s=[4, 3, 3] is shown in Table 1. The information set resulting from the block structure profile s=[3, 1, 2, 1, 2] is shown in Table 2. The information set resulting from the block structure profile s=[4, 1, 1, 1, 1, 1, 1] is shown in Table 3. From the graphical representation 500, it can be observed that even if the method 200 (of FIG. 2) results in polar codes with poor SC decoding performance, these polar codes present a huge performance gain when decoded under AE decoding due to their rich automorphism group. Moreover, the result is only 0.5 dB away from the 5G polar codes decoded under CRC-aided SCL-8, with much better latency and lower decoding complexity.

TABLE 1

Information set of (1024, 504) polar code
with block structure profile s = [4, 3, 3]

| 159 175 183 187 189 190 191 207 215 219 221 222 223 231 |
| 235 237 238 239 241 242 243 244 245 246 247 248 249 250 |
| 251 252 253 254 255 287 303 311 315 317 318 319 335 343 |
| 347 349 350 351 359 363 365 366 367 369 370 371 372 373 |

TABLE 1-continued

Information set of (1024, 504) polar code
with block structure profile s = [4, 3, 3]

374 375 376 377 378 379 380 381 382 383 399 403 405 406
407 409 410 411 412 413 414 415 419 421 422 423 425 426
427 428 429 430 431 433 434 435 436 437 438 439 440 441
442 443 444 445 446 447 451 453 454 455 457 458 459 460
461 462 463 465 466 467 468 469 470 471 472 473 474 475
476 477 478 479 481 482 483 484 485 486 487 488 489 490
491 492 493 494 495 496 497 498 499 500 501 502 503 504
505 506 507 508 509 510 511 543 559 567 571 573 574 575
591 599 603 605 606 607 615 619 621 622 623 625 626 627
628 629 630 631 632 633 634 635 636 637 638 639 655 659
661 662 663 665 666 667 668 669 670 671 675 677 678 679
681 682 683 684 685 686 687 689 690 691 692 693 694 695
696 697 698 699 700 701 702 703 707 709 710 711 713 714
715 716 717 718 719 721 722 723 724 725 726 727 728 729
730 731 732 733 734 735 737 738 739 740 741 742 743 744
745 746 747 748 749 750 751 752 753 754 755 756 757 758
759 760 761 762 763 764 765 766 767 783 787 789 790 791
793 794 795 796 797 798 799 803 805 806 807 809 810 811
812 813 814 815 817 818 819 820 821 822 823 824 825 826
827 828 829 830 831 835 837 838 839 841 842 843 844 845
846 847 849 850 851 852 853 854 855 856 857 858 859 860
861 862 863 865 866 867 868 869 870 871 872 873 874 875
876 877 878 879 880 881 882 883 884 885 886 887 888 889
890 891 892 893 894 895 899 901 902 903 905 906 907 908
909 910 911 913 914 915 916 917 918 919 920 921 922 923
924 925 926 927 929 930 931 932 933 934 935 936 937 938
939 940 941 942 943 944 945 946 947 948 949 950 951 952
953 954 955 956 957 958 959 961 962 963 964 965 966 967
968 969 970 971 972 973 974 975 976 977 978 979 980 981
982 983 984 985 986 987 988 989 990 991 992 993 994 995
996 997 998 999 1000 1001 1002 1003 1004 1005 1006
1007 1008 1009 1010 1011 1012 1013 1014 1015 1016
1017 1018 1019 1020 1021 1022 1023

TABLE 2

Information set of (1024, 504) polar code with block
structure profile s = [3, 1, 1, 2, 1, 2]

127 191 223 235 237 238 239 243 245 246 247 249 250 251
252 253 254 255 303 311 315 317 318 319 335 343 347 349
350 351 355 357 358 359 361 362 363 364 365 366 367 369
370 371 372 373 374 375 376 377 378 379 380 381 382 383
399 403 405 406 407 409 410 411 412 413 414 415 419 421
422 423 425 426 427 428 429 430 431 433 434 435 436 437
438 439 440 441 442 443 444 445 446 447 451 453 454 455
457 458 459 460 461 462 463 465 466 467 468 469 470 471
472 473 474 475 476 477 478 479 481 482 483 484 485 486
487 488 489 490 491 492 493 494 495 496 497 498 499 500
501 502 503 504 505 506 507 508 509 510 511 559 567 571
573 574 575 591 599 603 605 606 607 611 613 614 615 617
618 619 620 621 622 623 625 626 627 628 629 630 631 632
633 634 635 636 637 638 639 655 659 661 662 663 665 666
667 668 669 670 671 675 677 678 679 681 682 683 684 685
686 687 689 690 691 692 693 694 695 696 697 698 699 700
701 702 703 707 709 710 711 713 714 715 716 717 718 719
721 722 723 724 725 726 727 728 729 730 731 732 733 734
735 737 738 739 740 741 742 743 744 745 746 747 748 749
750 751 752 753 754 755 756 757 758 759 760 761 762 763
764 765 766 767 779 781 782 783 787 789 790 791 793 794
795 796 797 798 799 803 805 806 807 809 810 811 812 813
814 815 817 818 819 820 821 822 823 824 825 826 827 828
829 830 831 835 837 838 839 841 842 843 844 845 846 847
849 850 851 852 853 854 855 856 857 858 859 860 861 862
863 865 866 867 868 869 870 871 872 873 874 875 876 877
878 879 880 881 882 883 884 885 886 887 888 889 890 891
892 893 894 895 899 901 902 903 905 906 907 908 909 910
911 913 914 915 916 917 918 919 920 921 922 923 924 925
926 927 928 929 930 931 932 933 934 935 936 937 938 939
940 941 942 943 944 945 946 947 948 949 950 951 952 953
954 955 956 957 958 959 960 961 962 963 964 965 966 967
968 969 970 971 972 973 974 975 976 977 978 979 980 981
982 983 984 985 986 987 988 989 990 991 992 993 994 995
996 997 998 999 1000 1001 1002 1003 1004 1005 1006

TABLE 2-continued

Information set of (1024, 504) polar code with block
structure profile s = [3, 1, 1, 2, 1, 2]

1007 1008 1009 1010 1011 1012 1013 1014 1015 1016
1017 1018 1019 1020 1021 1022 1023

TABLE 3

Information set of (1024, 504) polar code with
block structure profile s = [4, 1, 1, 1, 1, 1, 1]

127 191 215 219 221 222 223 231 235 237 238 239 243 245
246 247 249 250 251 252 253 254 255 311 315 317 318 319
343 347 349 350 351 359 363 365 366 367 371 373 374 375
377 378 379 380 381 382 383 399 407 411 413 414 415 419
421 422 423 425 426 427 428 429 430 431 433 434 435 436
437 438 439 440 441 442 443 444 445 446 447 451 453 454
455 457 458 459 460 461 462 463 465 466 467 468 469 470
471 472 473 474 475 476 477 478 479 481 482 483 484 485
486 487 488 489 490 491 492 493 494 495 496 497 498 499
500 501 502 503 504 505 506 507 508 509 510 511 559 567
571 573 574 575 591 595 597 598 599 601 602 603 604 605
606 607 611 613 614 615 617 618 619 620 621 622 623 625
626 627 628 629 630 631 632 633 634 635 636 637 638 639
655 659 661 662 663 665 666 667 668 669 670 671 675 677
678 679 681 682 683 684 685 686 687 689 690 691 692 693
694 695 696 697 698 699 700 701 702 703 707 709 710 711
713 714 715 716 717 718 719 721 722 723 724 725 726 727
728 729 730 731 732 733 734 735 737 738 739 740 741 742
743 744 745 746 747 748 749 750 751 752 753 754 755 756
757 758 759 760 761 762 763 764 765 766 767 775 779 781
782 783 787 789 790 791 793 794 795 796 797 798 799 803
805 806 807 809 810 811 812 813 814 815 817 818 819 820
821 822 823 824 825 826 827 828 829 830 831 835 837 838
839 841 842 843 844 845 846 847 849 850 851 852 853 854
855 856 857 858 859 860 861 862 863 864 865 866 867 868
869 870 871 872 873 874 875 876 877 878 879 880 881 882
883 884 885 886 887 888 889 890 891 892 893 894 895 897
898 899 900 901 902 903 904 905 906 907 908 909 910 911
912 913 914 915 916 917 918 919 920 921 922 923 924 925
926 927 928 929 930 931 932 933 934 935 936 937 938 939
940 941 942 943 944 945 946 947 948 949 950 951 952 953
954 955 956 957 958 959 960 961 962 963 964 965 966 967
968 969 970 971 972 973 974 975 976 977 978 979 980 981
982 983 984 985 986 987 988 989 990 991 992 993 994 995
996 997 998 999 1000 1001 1002 1003 1004 1005 1006
1007 1008 1009 1010 1011 1012 1013 1014 1015 1016
1017 1018 1019 1020 1021 1022 1023

Various embodiments of the disclosure thus provide an apparatus 112 for generating a frozen set associated with a polar code of length 'N' and dimension 'K'. The frozen set is of size 'N–K' and comprises bit indices. The apparatus 112 comprises a processing unit 116 configured to take in input the polar code length 'N', the dimension 'K', and a profile of a structure of a block lower triangular affine (BLTA) group. The said BLTA group structure is associated with an affine transformation matrix of size 'n×n'. The said profile is defined by an ordered set of a plurality of values corresponding to block sizes of a plurality of blocks. The said blocks are sub-matrices of said affine transformation matrix with all the diagonals of said blocks in the same order as the ordered plurality of block sizes, forming the diagonal of said affine transformation matrix, each of the block sizes is such that 'n' is equal to the sum of said block sizes and 'n' is equal to $\log_2(N)$. The processing unit 116 is further configured to generate the frozen set so that the associated polar code admits all the affine automorphisms belonging to said BLTA group.

Various embodiments of the disclosure thus further provide a communication device 104 comprising an encoder 110 for encoding an information word to be input into a communication channel 106, said encoder 110 comprising an apparatus 112 according to aforementioned aspect and a processor 114 configured to generate a polar code codeword of the information word using the polar code associated with the frozen set generated by said apparatus 112.

Various embodiments of the disclosure thus further provide a method 200 for generating a frozen set associated with a polar code of length 'N' and dimension 'K'. The frozen set is of size 'N–K' and comprises bit indices. The method 200 comprises taking in input the polar code length 'N', the dimension 'K', and a profile of a structure of a block lower triangular affine (BLTA) group. The said BLTA group structure is associated with a affine transformation matrix of size 'n×n'. The said profile is defined by an ordered set of a plurality of values corresponding to block sizes of a plurality of blocks. The said blocks are sub-matrices of said affine transformation matrix with all the diagonals of said blocks in the same order as the ordered plurality of block sizes, forming the diagonal of said affine transformation matrix, each of the block sizes being such that 'n' is equal to the sum of said block sizes and 'n' is equal to $\log_2(N)$. The method 200 further comprises generating the frozen set so that the associated polar code admits all the affine automorphisms belonging to said BLTA group.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural. The word "exemplary" is used herein to mean "serving as an example, instance or illustration". Any embodiment described as "exemplary" is not necessarily to be construed as preferred or advantageous over other embodiments and/or to exclude the incorporation of features from other embodiments. The word "optionally" is used herein to mean "is provided in some embodiments and not provided in other embodiments". It is appreciated that certain features of the present disclosure, which are, for clarity, described in the context of separate embodiments, may also be provided in combination in a single embodiment. Conversely, various features of the present disclosure, which are, for brevity, described in the context of a single embodiment, may also be provided separately or in any suitable combination or as suitable in any other described embodiment of the disclosure.

The invention claimed is:

1. An apparatus for generating a frozen set associated with a polar code of length N and dimension K, the frozen set being of size N–K and comprising bit indices, the apparatus comprising a processing unit configured to:

obtain as an input the polar code length N, the polar code dimension K, and a profile;

generate the frozen set so that the associated polar code admits all affine automorphisms belonging to a block lower triangular affine (BLTA) group consistent with the profile, wherein:

said BLTA group being associated with an affine transformation matrix of size n×n, said profile being defined by an ordered set of a plurality of values corresponding to block sizes of a plurality of blocks, said blocks being sub-matrices of said affine transformation matrix, all the diagonals of said blocks forming the diagonal of said affine transformation matrix, and each of the block sizes being such that n is equal to the sum of said block sizes and n is equal to $\log_2(N)$;

generate a generating monomials set so that the associated polar code admits all the affine automorphisms belonging to the BLTA group, and generate the frozen set from said generating monomials set;

encoding data using the polar code associated with the frozen set; and sending the data encoded using the polar code associated with the frozen set.

2. The apparatus according to claim 1, wherein the blocks are upper diagonal sub-matrices.

3. The apparatus according to claim 1, wherein the processing unit is further configured to determine an initial generating monomials set, define a current generating monomial set as being the initial generating monomials set, and perform a loop, said loop comprising repeating, for each given block of the ordered blocks corresponding to the ordered block sizes in the profile:

a determination of a set of generating monomials corresponding to said given block, and a modification of the current generating monomials set by concatenation with the determined generating monomials corresponding to said given block.

4. The apparatus according to claim 3, wherein the processing unit is further configured to determine the initial generating monomials set by using a predefined polar code of length N and dimension K, having a predefined signal-to-noise ratio, the initial generating monomials set containing the K–1 most reliable monomials of the generating monomials set of the predefined polar code.

5. The apparatus according to claim 3, wherein the processing unit is further configured to check, at each stage of the loop, the dimension of the modified current generating monomials set, and if said dimension is greater than K, stop the loop and restart the loop from the first block of the ordered blocks corresponding to the ordered block sizes in the profile, with a new initial generating monomials set.

6. The apparatus according to claim 3, wherein the processing unit is further configured to check, at the last stage of the loop, the dimension of the modified current generating monomials set, and if said dimension is equal to K, determine the generating monomials set as being the current generating monomials set, if said dimension is not equal to K, stop the loop and restart the loop from the first block of the ordered blocks corresponding to the ordered block sizes in the profile, with a new initial generating monomials set.

7. The apparatus according to claim 6, wherein the processing unit is further configured to:

when the dimension of the modified current generating monomials set is greater than 1, determine the new initial generating monomials set by using a predefined polar code of length N and having a new dimension equal to the previous dimension minus 1, and having the predefined signal-to-noise ratio, the initial generating monomials set containing a number of most reliable monomials of the generating monomials set of the predefined polar code corresponding to the new dimension minus 1; and when the dimension of the modified current generating monomials set is equal to 1, determine the new initial generating monomials set by using a predefined polar code of length N and of dimension K, and having a new predefined signal-to-noise ratio corresponding to the previous predefined signal-to-noise ratio incremented by a given incremental value, the initial generating monomials set containing the K−1 most reliable monomials of the generating monomials set of the predefined polar code.

8. The apparatus according to claim 1, wherein the processing unit further comprises a processor configured to generate a polar code codeword of the information word using the polar code associated with the frozen set generated by said apparatus.

9. A method for generating a frozen set associated with a polar code of length N and dimension K, the frozen set being of size N−K and comprising bit indices, performed by a processing unit, the method comprising:

obtaining as an input the polar code length N, the polar code dimension K, and a profile; and generating the frozen set so that the associated polar code admits all the affine automorphisms belonging to a block lower triangular affine (BLTA) group consistent with the profile, wherein:

said BLTA group being associated with an affine transformation matrix of size n×n, said profile being defined by an ordered set of a plurality of values corresponding to block sizes of a plurality of blocks, said blocks being sub-matrices of said affine transformation matrix, all the diagonals of said blocks forming the diagonal of said affine transformation matrix, and each of the block sizes being such that n is equal to the sum of said block sizes and n is equal to $\log_2(N)$;

generating a generating monomials set so that the associated polar code admits all the affine automorphisms belonging to the BLTA group, and generating the frozen set from the said generating monomials set;

encoding data using the polar code associated with the frozen set; and sending the data encoded using the polar code associated with the frozen set.

10. The method according to claim 9, wherein the blocks are upper diagonal sub-matrices.

11. The method according to claim 9, further comprising determining an initial generating monomials set, defining a current generating monomial set as being the initial generating monomials set, and performing a loop, said loop comprising repeating, for each given block of the ordered blocks corresponding to the ordered block sizes in the profile:

determining a set of generating monomials corresponding to said given block, and modifying the current generating monomials set by concatenation with the determined generating monomials corresponding to said given block.

12. The method according to claim 11, further comprising determining the initial generating monomials set by using a predefined polar code of length N and dimension K, having a predefined signal-to-noise ratio, the initial generating monomials set containing the K−1 most reliable monomials of the generating monomials set of the predefined polar code.

13. The method according to claim 11, further comprising checking, at each stage of the loop, the dimension of the modified current generating monomials set, and if said dimension is greater than K, stopping the loop and restarting the loop from the first block of the ordered blocks corresponding to the ordered block sizes in the profile, with a new initial generating monomials set.

14. The method according to claim 11, further comprising checking, at the last stage of the loop, the dimension of the modified current generating monomials set, and:

if said dimension is equal to K, determining the generating monomials set as being the current generating monomials set;

if said dimension is not equal to K, stopping the loop and restarting the loop from the first block of the ordered blocks corresponding to the ordered block sizes in the profile, with a new initial generating monomials set.

15. The method according to claim 14, further comprising:

when the dimension of the modified current generating monomials set is greater than 1, determining the new initial generating monomials set by using a predefined polar code of length N and having a new dimension equal to the previous dimension minus 1, and having the predefined signal-to-noise ratio, the initial generating monomials set containing a number of most reliable monomials of the generating monomials set of the predefined polar code corresponding to the new dimension minus 1; and when the dimension of the modified current generating monomials set is equal to 1, determining the new initial generating monomials set by using a predefined polar code of length N and of dimension K, and having a new predefined signal-to-noise ratio corresponding to the previous predefined signal-to-noise ratio incremented by a given incremental value, the initial generating monomials set containing the K−1 most reliable monomials of the generating monomials set of the predefined polar code.

* * * * *